(12) United States Patent
Wu et al.

(10) Patent No.: US 7,644,323 B2
(45) Date of Patent: *Jan. 5, 2010

(54) METHOD AND APPARATUS OF BUILD-IN SELF-DIAGNOSIS AND REPAIR IN A MEMORY WITH SYNDROME IDENTIFICATION

(75) Inventors: Cheng-Wen Wu, Hsinchu (TW); Rei-Fu Huang, Tainan (TW); Chin-Lung Su, Taipei (TW); Wen-Ching Wu, Hsinchu (TW); Kun-Lun Luo, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 323 days.

This patent is subject to a terminal disclaimer.

(21) Appl. No.: 11/742,567

(22) Filed: Apr. 30, 2007

(65) Prior Publication Data

US 2007/0288807 A1    Dec. 13, 2007

Related U.S. Application Data

(63) Continuation-in-part of application No. 11/001,345, filed on Nov. 30, 2004, now Pat. No. 7,228,468.

(51) Int. Cl.
G11C 29/00    (2006.01)

(52) U.S. Cl. .............................. 714/710; 714/2; 714/6; 714/7; 714/25; 714/30; 714/42; 714/711; 714/715; 714/718; 714/719; 714/723; 714/733; 714/734; 365/201

(58) Field of Classification Search ........................ None
See application file for complete search history.

(56) References Cited

U.S. PATENT DOCUMENTS 5,161,157 A * 11/1992 Owen et al. ................. 714/710
6,026,505 A * 2/2000 Hedberg et al. ............. 714/711
6,373,758 B1 * 4/2002 Hughes et al. .............. 365/200
6,408,401 B1 * 6/2002 Bhavsar et al. ................. 714/7
6,574,757 B1 * 6/2003 Park et al. ................... 714/710
6,771,549 B1 * 8/2004 Konuk et al. ................ 365/200

(Continued)

FOREIGN PATENT DOCUMENTS

EP    1447813 A1 *    8/2004

OTHER PUBLICATIONS

Jin-Fu Li et al., "A Buit-In Self-Repair Scheme for Semiconductor Memories with 2-D Redundancy", Sep. 30-Oct. 2, 2003, IEEE International Test Conference, pp. 393-402.*

*Primary Examiner*—John P Trimmings

(57) ABSTRACT

Disclosed is a build-in self-diagnosis and repair method and apparatus in a memory with syndrome identification. It applies a fail-pattern identification and a syndrome-format structure to identify at least one type of faulty syndrome in the memory during a memory testing, then generates and exports fault syndrome information associated with the corresponding faulty syndrome. According to the fault syndrome information, the method applies a redundancy analysis algorithm, allocates spare memory elements and repairs the faulty cells in the memory. The syndrome-format structure respectively applies single-faulty-word-syndrome format, faulty-row-segment-syndrome format, and faulty-column-segment-syndrome format for different faulty syndromes, such as faulty row segments and single faulty words, faulty column segments and single faulty words, all of single faulty words, faulty row segments and faulty column segments, and so on.

23 Claims, 13 Drawing Sheets

U.S. PATENT DOCUMENTS

| | | | |
|---|---|---|---|
| 6,907,554 B2 * | 6/2005 | Adams et al. | 714/718 |
| 6,928,377 B2 * | 8/2005 | Eustis et al. | 702/118 |
| 7,200,786 B2 * | 4/2007 | Cheng et al. | 714/733 |
| 7,237,154 B1 * | 6/2007 | Zorian | 714/711 |
| 7,430,694 B2 * | 9/2008 | Andreev et al. | 714/718 |
| 2004/0225912 A1 * | 11/2004 | Ronza et al. | 714/5 |

\* cited by examiner word under test (word 0)

| conventional syndrome format | session | address | word syndrome |
|---|---|---|---|

FIG. 5a

| single-faulty-word-syndrome format | 00 | session | address | compressed word syndrome | | |
|---|---|---|---|---|---|---|
| faulty-row-segment-syndrome format | 11 | session | address | end column | end row indicator | |
| faulty-column-segment-syndrome format | 01 | session | address | end row | end column indicator | compressed word syndrome |

FIG. 5b

METHOD AND APPARATUS OF BUILD-IN SELF-DIAGNOSIS AND REPAIR IN A MEMORY WITH SYNDROME IDENTIFICATION

CROSS REFERENCE

This is a continuation-in-part application of application Ser. No. 11/001,345 filed Nov. 30, 2004, now U.S. Pat. No. 7,228,468, issued Jun. 5, 2007.

FIELD OF THE INVENTION

The present invention generally relates to syndrome identification for a memory testing, and more specifically to a build-in self-diagnosis and repair (BISD/R) method and apparatus in a memory with syndrome identification.

BACKGROUND OF THE INVENTION

With the advent of technology, the size and working speed of memory core have increased dramatically in today's integrated circuits, and the integration of system-on-chip (SoC) becomes more and more popular. As the SOC design grows, demand for embedded memory also increases. The memory core in the SOC design normally has larger area than other cores, and its density is also higher than that of logic cores. Therefore, the memory yield often dominates the yield of a SoC chip. SoC chips usually have poor yield. An efficient method for improving the SoC yield is increasing the memory yield.

To improve the memory yield, efficient diagnosis and repair schemes are needed. The diagnosis scheme can detect the weakness of product and then modify design or process, and the repair scheme can replace the faulty cell with spare memory. Both of them can enhance the yield of memory cores. Embedded memory cores are widely used in SOC applications but they cannot be easily accessed from external circuitry. So these schemes should be realizable in circuit with acceptable area overhead. In other word, the area overhead of the built-in self-diagnosis (BISD) or built-in self-repair (BISR) should be low to reduce area penalty.

Testing of embedded memory is normally done by built-in self-test (BIST). A BIST scheme that also collects and exports the diagnostic data for subsequent on-line or off-line analysis has been called a BISD scheme. The exported diagnostic data can be used to, e.g., construct the bit-maps, identify the failure modes, repair the faulty cells, etc.

Frequently, the volume of diagnostic data of faulty memory cores is too large to be stored in the automatic test equipment (ATE), due to very limited space of the capture memory in a typical ATE. A solution to this problem is compression of diagnostic data. Recently, there are memory researches focusing on this subject. Some researchers define several frequently seen fail patterns, and compress the bit-maps based on these fail patterns. If the bit-maps relate to large memories, they are frequently compressed with fail patterns. The compression of output response from the BIST circuit can be found in the literature. The method is similar to signature analysis in logic BIST.

Fault-syndrome compression approaches have been proposed recently, where a partial Huffman-tree and other techniques are used to improve the compression ratio while maintaining a low BISD hardware cost.

FIG. 1 is a block diagram of a conventional BIST/BISD architecture that comprises three blocks, a controller 101, a sequencer 103 and a test pattern generator (TPG) 105. The controller 101 is the interface between the BIST/D and ATE. The sequencer 103 has a finite state machine (FSM), and is the main part of the BIST/D design. It controls the TPG 105 executing the test commands from the controller 101, and is also responsible for shifting out the fault syndromes. The TPG 105 has two main functions—decoding the test commands sent from the sequencer 103 and comparing the memory output with the expected data. The TPG 105 is thus highly dependent on the memory specifications, especially on the memory timing parameters and access modes. In physical design, it should be placed as close to the memory as possible to avoid possible timing violations. The sequencer 103 also becomes a complex circuit block if the BIST/D supports fail-pattern identification scheme.

FIG. 1 shows the input/output (I/O) signals MCK, MSI, MBC, MBS, MBO, MRD, MBR, and MSO, which represent the memory BISD-clock, memory BISD-scan-in, memory BISD-control, memory BISD mode selection, memory BISD-output, memory BISD-ready, memory BISD-reset, and memory BISD-scan-out signals, respectively.

Referring to FIG. 1, the operation of I/O signals is further explained herein below. For a synchronous RAM, MCK is usually the same as the memory clock so that at-speed test can be performed. The MSI input is for scan in test commands to the programmable BISD. The MBC signal controls the finite state machine (FSM) of the controller 101. Whether the system is in normal mode or BIST/BISD mode is determined by MBS. MBO outputs the test results, indicating whether the memory is good (1) or bad (0). As soon as the test process is finished, MRD goes high, else it stays low. The MBR signal is an asynchronous reset signal. Finally, MSO is used to scan out the error information for diagnosis or redundancy repair.

Diagnosis can help designers understand the weakness of the product, and redundancy repair can increase the yield of the product. The BISR design is the trend of the embedded memory, and there are many researches on this subject. Among them, the infrastructure IPs (IIPs) has been applied for yield enhancement. A memory core with BISR design is an important IIP. A BISR design with comprehensive real-time exhaustive search test and analysis method has been published. There are many types of redundancy structures. Among them, the word redundancy repair scheme was proposed early.

Another example is using a power-on repair BISR design with spare columns (1-D redundancy) only. The 2-D redundancy structure with segment partition and heuristic redundancy analysis (RA) algorithm was also studied. The authors applied a static and dynamic data-bin repair scheme or an on-line BISR design with a transparent BIST algorithm for SRAMs.

These redundancy repair researches focus on different applications, and they stress the importance of the BISR design.

FIG. 2 shows a typical BISR design which comprises three main blocks, BIST 201, built-in redundancy-analysis (BIRA) 203, and address reconfiguration (AR) 205.

The BIST 201 detects faults in the memory and exports the fault syndrome to the BIRA 203. The fault coverage of the BIST 201 depends on the test algorithms it implements. The fault syndrome generated by the BIST 201 contains the address of the faulty cell or word. The BIRA 203 receives the fault syndrome from the BIST 201 and analyzes the information using a built-in redundancy analysis algorithm. The BIRA 203 has two major functions: RA and spare element configuration.

The redundancy analysis algorithm is the main part of the BISR design, and it usually has two phases, must-repair phase and final spare allocation phase. The phase-1, must-repair phase, is used to identify the faulty rows or columns that must be repaired by spare rows or columns. In the second phase, the remaining faulty cells are repaired by the available spare elements not used in phase-1. This is normally done by simple heuristics. Most of the remaining faults in phase-2 are single-cell faults, and most of them are orthogonal with each other. The RA algorithm should be easy to implement, and be cost effective. Although exhaustive-search RA algorithms generate optimal spare allocation results, they are costly to implement and thus impractical.

Selection of an appropriate RA algorithm is highly related to the number of spare elements and their structure. This can be efficiently evaluated by a simulator which reports the repair rates for different RA algorithms and spare element configurations. Based on the repair rates, users will be able to select the most cost effective one for using in the BISR implementation.

The AR circuit is used to 'repair' the memory, i.e., it replaces the faulty cells with the fault-free spare ones. This is normally done by address remapping or address decoder reconfiguration (by, e.g., switches or fuses). If there is a non-volatile memory on chip, it can be used to store the reconfiguration information even when the power is off. Alternatively, power-on BIST and BISR can be used.

The complexity of an AR circuit depends partly on the spare structure, i.e., structure of spare rows, columns, words, blocks, etc. The complexity increases with the number of spare elements. Another important issue in the AR circuit design is performance penalty because it affects the access time of the memory during normal operation. The performance penalty due to address reconfiguration should be as low as possible.

SUMMARY OF THE INVENTION

The examples of the present invention may provide a build-in self-diagnosis and repair (BISD/R) method and apparatus in a memory with syndrome identification. The BISD/R method of this invention applies a fail-pattern identification and a syndrome-format structure to identify at least one type of faulty syndrome in the memory during a memory testing, then generates and exports fault syndrome information associated with the corresponding faulty syndrome. According to the fault syndrome information, the BISD/R method applies a redundancy analysis algorithm, allocates spare memory elements and repairs the faulty cells in the memory.

In the invention, the syndrome-format structure respectively applies single-faulty-word-syndrome format, faulty-row-segment-syndrome format, and faulty-column-segment-syndrome format for different faulty syndromes.

The BISD and the BISR designs of this invention have been demonstrated through hardware implementation. This hardware design integrates the BIRA, AR and BIST/D circuits of the present invention. The BISD/R apparatus of this invention comprises a built-in self test circuit with enhanced faulty syndrome identification, a BIRA circuit with improved redundancy utilization, and an AR circuit with reducing timing penalty during normal access. Wherein the fail pattern identification and the syndrome-format structure are implemented to identify and repair at least one type of faulty syndrome in the memory during a memory testing, and the syndrome-format structure respectively applies single faulty-word-syndrome format, faulty-row-segment-syndrome format, and faulty-column-segment-syndrome format for different faulty syndromes.

With the three types of syndrome formats, the fail-pattern identification may identify three basic faulty syndromes and their combinations, such as faulty row segments and single faulty words, faulty column segments and single faulty words, all the three basic faulty syndromes, and so on.

During a memory testing, the built-in self test circuit may be implemented by an FSM which has a state diagram. In the invention, three examples of the state diagrams are shown. The first example identifies faulty row segments, faulty column segments and single faulty words in the memory. The second example identifies faulty row segments and single faulty words in the memory. The third example identifies faulty column segments and single faulty words in the memory.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

FIG. 5a shows a conventional fault syndrome.

FIG. 5b shows three kinds of fault syndromes according to the invention.

DETAILED DESCRIPTION OF THE PREFERRED EMBODIMENTS

Figure 1:
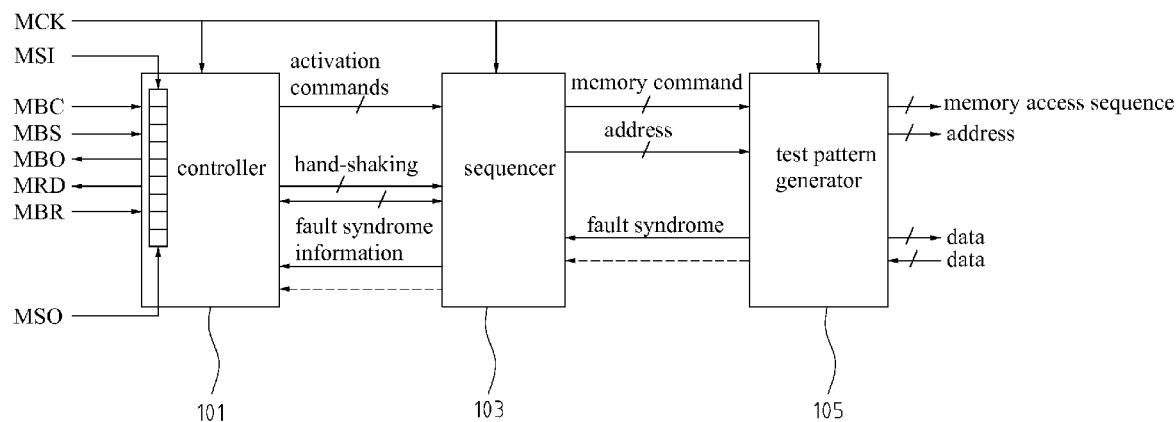
FIG. 1 shows a block diagram of a conventional BIST/BISD architecture.
Figure 2:
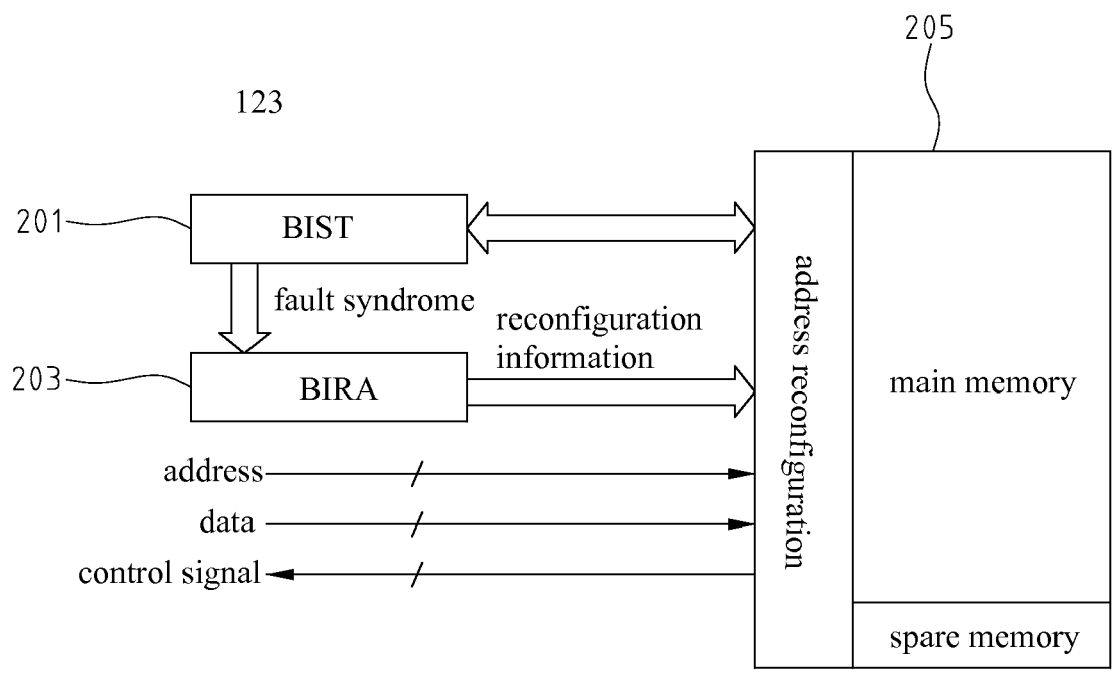
FIG. 2 shows a typical BISR design with three main blocks, BIST, BIRA, and AR.
Figure 3:
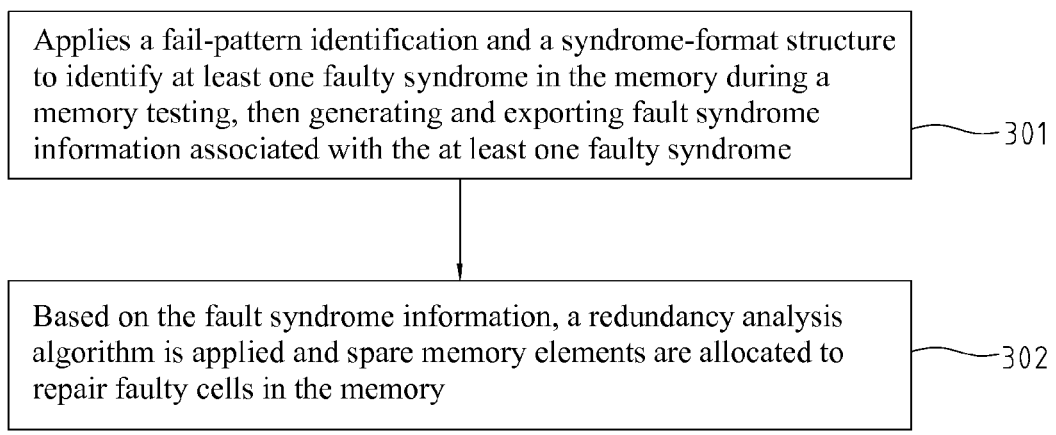
FIG. 3 shows a schematic diagram illustrating the method of BISD/R in a memory with syndrome identification according to the invention.

FIG. 3 depicts a schematic diagram illustrating the method of BISD/R in a memory with syndrome identification according to the invention. It comprises two major steps, 301 and 302. It applies a fail-pattern identification and a syndrome-format structure to identify at least one type of faulty syndrome in the memory during a memory testing, then generating and exporting fault syndrome information associated with the at least one faulty syndrome, as shown in step 301. Based on the fault syndrome information, a redundancy analysis algorithm is applied and spare memory elements are allocated to repair faulty cells in the memory, as shown in step 302.

In the present invention, different syndrome formats are respectively applied in the syndrome-format structure for different faulty syndromes. The fail-pattern identification and the syndrome-format structure used in step 301 are further described in detail in the following.

Figure 4:
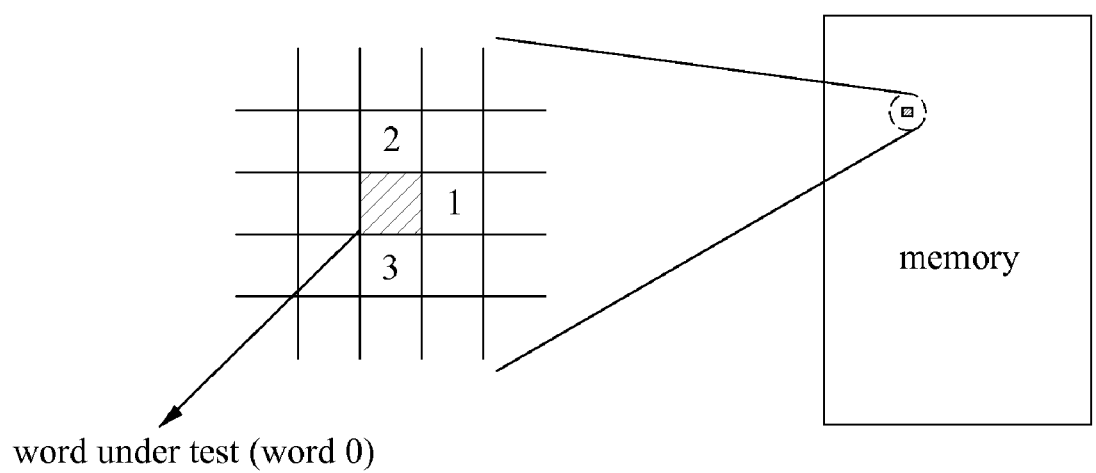
FIG. 4 shows a memory array under test, in which the shaded region in the left diagram represents the word under test.

FIG. 4 shows a memory array under test. The shaded region in the left diagram is the word under test (WUT), representing word 0. The adjacent word 1 on the right is said to be in the same row as the word 0. The adjacent words 2 and 3, located above or under the word 0 respectively, are said to be in the same column as the word 0.

Based on the above definition, three basic types of faulty syndromes and their combinations can be identified by the fail-pattern identification. The basic three types of faulty syndromes are single faulty words, faulty row segments and faulty column segments. The fail-pattern identification arranges three basic fail-patterns, and each of the three basic fail-patterns has an associated syndrome-format. With the three syndrome formats, the fail-pattern identification may identify three basic faulty syndromes and their combinations, such as faulty rows and single faulty words, faulty columns and single faulty words, all the three basic kinds of fault type, and so on.

As shown in FIG. 5a, the conventional syndrome includes three fields, which are session, address, and word syndrome. The session field records the read operation that detects the fault. For example, if there are five read operations, the session field will have three bits and the second read operation will have a session identifier (ID) of 001. Since the address field stores the address of the faulty word, its length is equal to the length of a normal word address. The word syndrome field stores the Hamming syndrome of the faulty word at the current state, which represents the faulty cells in this word.

In the present invention, three basic fail-patterns are adopted, i.e. single-faulty words, faulty row segments and faulty column segments. Each of the three basic fail-patterns has an associated syndrome-format, which are referred to single-faulty-word-syndrome format, faulty-row-segment-syndrome format, and faulty-column-segment-syndrome format, respectively.

Referring to FIG. 5b, the single-faulty-word-syndrome format includes four fields, which are syndrome ID, session, address, and compressed word syndrome. The syndrome ID is for storing a single-faulty-word pattern. The session field is for storing a read operation that detects a single faulty word. The address field is for storing the address of the single fault word. The compressed word syndrome field is for storing a compressed word syndrome of an original word syndrome. The compressed word syndrome is obtained from the original word syndrome, after a compression method. For example, the compression by Huffman code is used. The syndrome of single faulty words is shorter than the original syndrome because the Huffman-code compression is efficient for sparse Hamming syndromes.

The faulty-row-segment-syndrome format includes five fields, which are syndrome ID for storing a faulty-row-segment pattern, session for storing a read operation that detects a faulty row segment, address for indicating the starting row address of the first faulty word, end column for storing the column address of a last faulty word in the faulty row, and end row indicator. The last faulty word may not have the same row address as the first faulty word. The row address of the last faulty word is known through the end row indicator.

The faulty-column-segment-syndrome format is similar to the faulty-row segment-syndrome format, except that it has a compressed word syndrome field. In other words, the faulty-column-segment-syndrome format includes six fields, which are syndrome ID, session, address, end row, end column indicator and compressed syndrome. The address field indicates the starting column address of the first faulty word. The compressed syndrome_field is for storing a compressed word syndrome of an original word syndrome. Though the faulty column segment syndrome may be longer than the original syndrome, it actually represents multiple faulty words in the same column segment and still has high compression efficiency.

For the three syndrome formats, the syndrome ID is used to distinguish the fail patterns. For example, 00, 11, and 01 may represent the single faulty words, faulty rows, and faulty columns, respectively. The session field is used to store a read operation that detects a corresponding fail pattern.

The compression ratio is defined as the ratio between the size of the compressed data and that of the original data. Assuming that S and W represent the lengths of a symbol (Huffman code word) and a memory word, respectively; Ns, Nr, and Nc denote the numbers of single faulty words, faulty row segments and faulty column segments, respectively; Ls, Lr, Lc, and Lo represent the lengths of the single faulty words syndrome, faulty row segments syndrome, faulty column segments syndrome, and original (uncompressed) syndrome, respectively; and Nf is the number of all faulty words in the memory, the compression ratio can be calculated as CR= (NsLs+NrLr+NcLc)/(NfLo). The defect distribution, which is not considered in this simple analysis, is known to affect the compression ratio. More accurate estimation of the compression ratio should be obtained by simulation.

As described earlier, a typical BISR design has three main blocks: BIST, BIRA, and AR. A conventional BIST/BISD architecture consists of three blocks, a controller, a sequencer and a TPG. The sequencer has an FSM, and is the main part of the BIST/D design. In the present invention, the BIRA, AR and BIST/D circuits are reconstructed and integrated to improve the diagnosis and the repair apparatus.

Figure 6A:
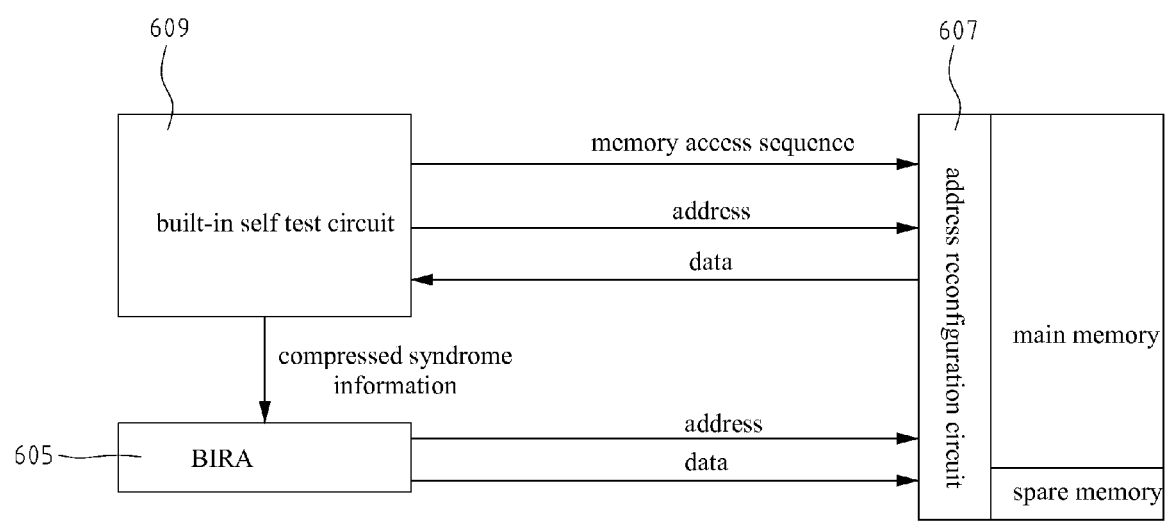
FIG. 6a shows the block diagram of the build-in self-diagnosis and repair apparatus according to the invention.

Accordingly, FIG. 6a shows the block diagram of the build-in self-diagnosis and repair apparatus according to the invention. The apparatus comprises a built-in self-test circuit 609 with enhanced faulty syndrome identification, a BIRA circuit 605 with improved redundancy utilization, and an AR circuit 607 with reducing timing penalty during normal access. Wherein a fail pattern identification and a syndrome-format structure are implemented to identify and repair at least one faulty syndrome in the memory during a memory testing, and the syndrome-format structure respectively applies faulty-word-segment-syndrome format, faulty-row-segment-syndrome format, and faulty-column-segment-syndrome format for different faulty syndromes, such as faulty row segments and single faulty words, faulty column segments and single faulty words, all of single faulty words, faulty row segments and faulty column segments, and so on.

Figure 6B:
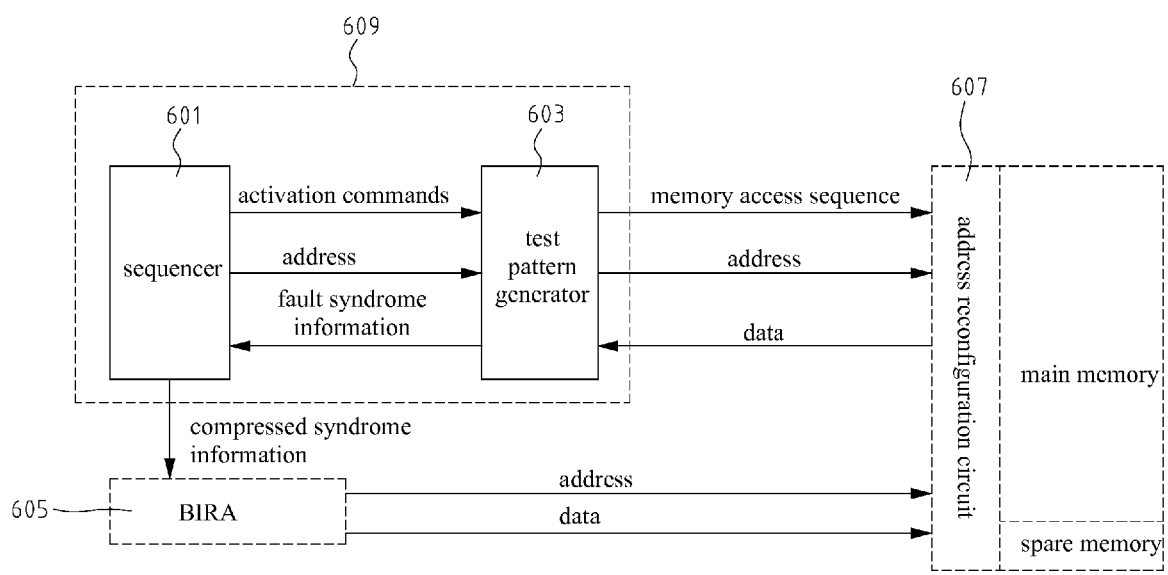
FIG. 6b shows the architecture of the built-in self test circuit according to the invention.

FIG. 6b shows the architecture of the built-in self-test circuit according to the invention for enhancing faulty syndrome identification. The built-in self-test circuit 609 further includes a sequencer 601 and a TPG 603. The sequencer 601 receives encoded data and activation commands, performs test commands and fault syndrome identification for the memory, and compresses fault syndrome information. It also shifts out the compressed fault syndrome information to the BIRA 605 during the memory testing, and generates test commands to TPG 603. The TPG 603 decodes the test commands sent from the sequencer 601. The fault syndrome information are collected by the TPG 603 and then forwarded to the sequencer 601 for analysis and compression.

Based on the compressed fault syndrome, the BIRA 605 identifies the must-repair memory elements and the remaining faulty cells by using a built-in redundancy analysis (RA) algorithm. When a fault in the memory is detected, the AR circuit 607 performs the address reconfiguration for the memory to repair the must-repair elements and the remaining faulty cells.

Figure 7A:
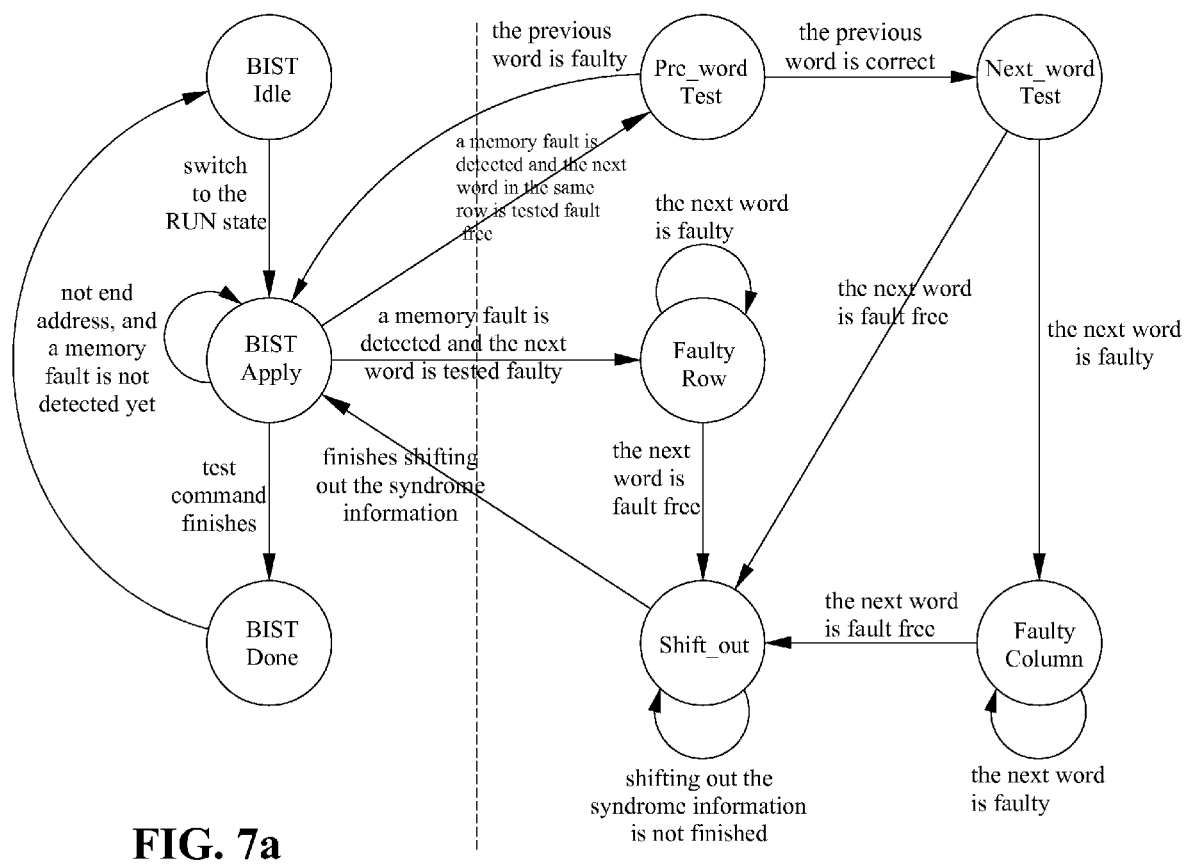
FIG. 7a shows an example that the built-in self test circuit in FIG. 6b is implemented by an FSM to identify faulty row segments, faulty column segments and single faulty words in the memory.
Figure 7B:
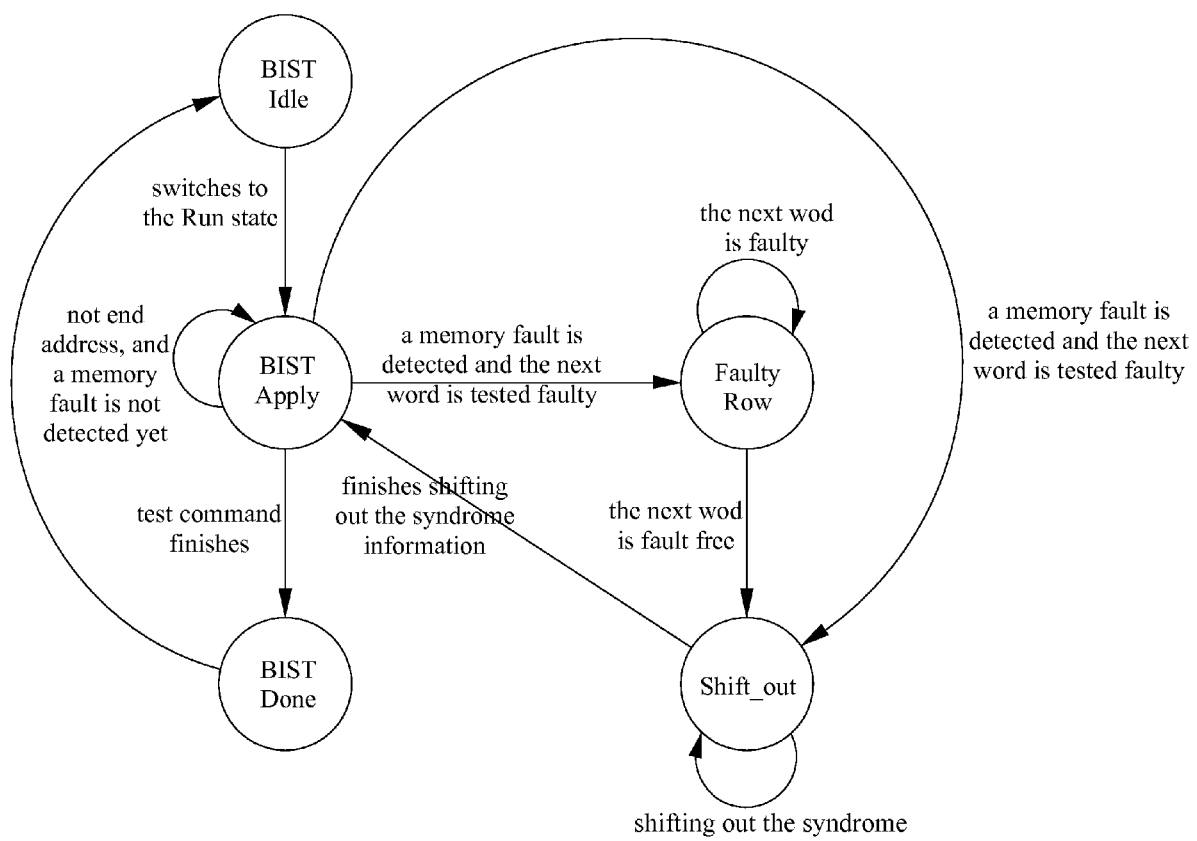
FIG. 7b shows an example that the built-in self test circuit in FIG. 6b is implemented by an FSM to identify faulty row segments and single faulty words in the memory.
Figure 7C:
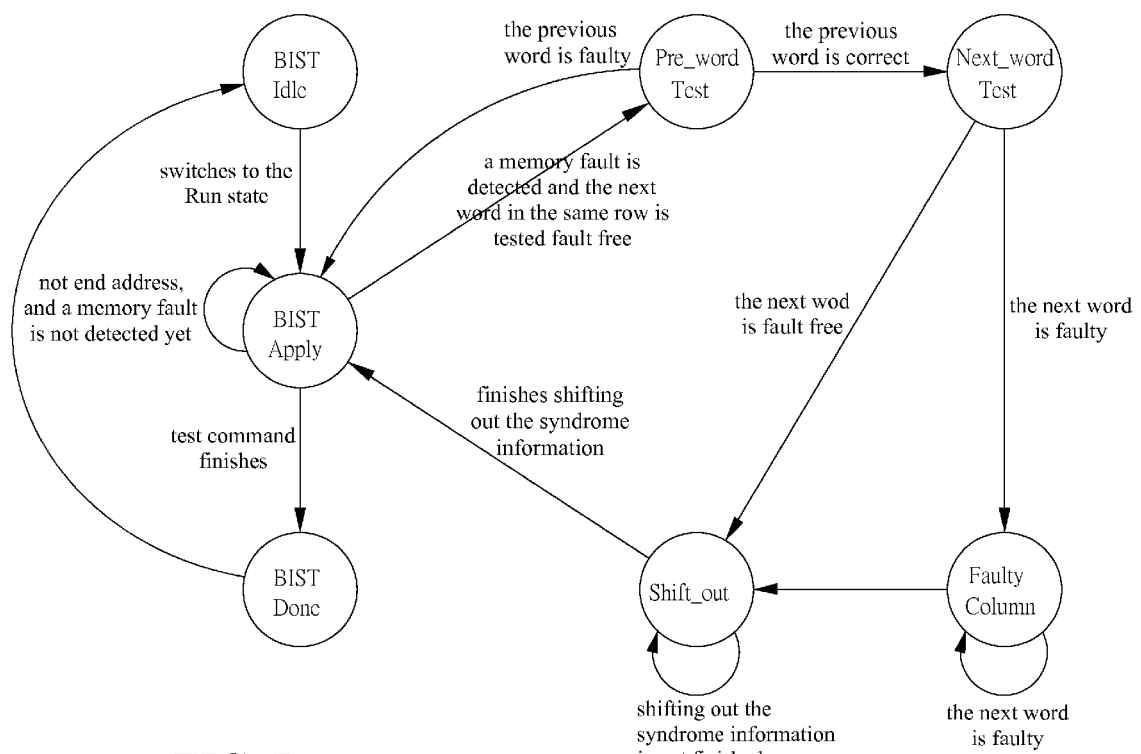
FIG. 7c shows an example that the built-in self test circuit in FIG. 6b is implemented by an FSM to identify faulty column segments and single faulty words in the memory.

During a memory testing, the built-in self-test circuit 609 can be implemented by an FSM which has a state diagram. FIG. 7a shows an example that the built-in self-test circuit is implemented by an FSM to identify faulty row segments, faulty column segments and single faulty words in the memory. FIG. 7b shows an example that the built-in self-test circuit is implemented by an FSM to identify faulty row segments and single faulty words in the memory. FIG. 7c shows an example that the built-in self-test circuit is implemented by an FSM to identify faulty column segments and single faulty words in the memory.

Referring to FIG. 7a, the state diagram has eight states for identifying faulty row segments, faulty column segments and single faulty words in the memory. These eight states can be further grouped into three main categories, which are test execution state, fail-pattern identification state, and shift out state. The eight states are grouped and described in detail below.

The test execution state follows the conventional BIST design, and its functions are trivial. It includes the following three states:

(a1) BIST Idle: the initial state. It goes to BIST Apply when the controller switches to the Run state.

(a2) BIST Apply: the test execution state. It executes the test command sent from the controller. If a memory fault is detected, it pauses and hands the control over to the fail-pattern identification state (described below).

(a3) BIST Done: the terminating state. When the test command has been executed and finished, the sequencer goes to this state, and then goes back to BIST Idle and waits for the next test command.

The fail-pattern identification state include the following four states:

(b1) Faulty Row: when a memory fault is detected in the BIST Apply state, the sequencer circuit continues to test the next word. When the next word is also faulty, it goes to the faulty row state, and stays there until a fault-free word appears. It then goes to the Shift_out state for fault syndrome exporting.

(b2) Pre_word Test: when a memory fault is detected in the BIST Apply state and the next word in the same row is tested fault free, it goes to the Pre_word test state. This state is used to confirm if the WUT is covered by the previous faulty column pattern. If the previous word in the same column is faulty (with the same Word Syndrome), the WUT is covered by the previous faulty column pattern and the sequencer goes back to the BIST Apply state without shifting out any data.

(b3) Next_word test: if the previous word in the same column is correct or it has a different word syndrome from the WUT, the sequencer goes to the Next_word test state, unless the end of the column is reached. This state is used to test the next word in the same column.

(b4) Faulty Column: in Next_word test, if the next word is also faulty, it goes to the Faulty Column state and continues to test subsequent words until a correct word is detected (in that case it goes to the Shift_out state for fault syndrome exporting).

The Shift_out state: In Next_word test, if the next word is fault free or the WUT is the last word in the column, the WUT is a single faulty word, so the sequencer goes to the Shift_out state. It is used to shift out the syndromes. When the sequencer has finished shifting, it goes back to the BIST Apply state and the test process resumes.

If the memory is fault-free, the sequencer will only run in the test execution states, i.e., BIST Idle, BIST Apply, and BIST Done. It will then look like a typical BIST design, and in this case the testing time does not increase.

Referring to FIG. 7b, the state diagram only has five states for identifying faulty rows and single faulty words in the memory. Compared with FIG. 7a, the fail-pattern identification state in FIG. 7b does not include three states, which are Pre_word, Next_word test, and Faulty Column. Furthermore, when a memory fault is detected in the BIST Apply state and the next word is tested fault free, it goes to the Shift_out state.

Referring to FIG. 7c, the state diagram has seven states for identifying faulty columns and single faulty words in the memory. Compared with FIG. 7a, the fail-pattern identification state in FIG. 7c does not include only Faulty Row state. Furthermore, all the operation flow and functions of the states in FIG. 7c are same as that in FIG. 7a.

Figure 8:
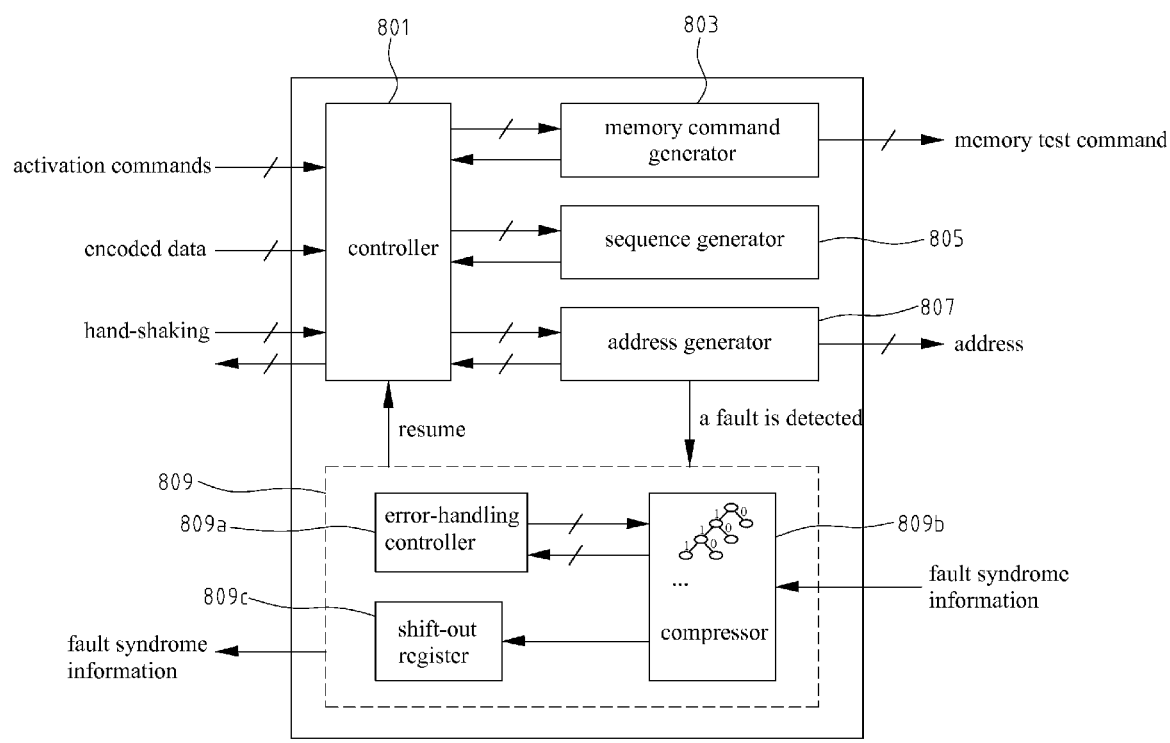
FIG. 8 shows the architecture of the sequencer according to the invention for enhancing fail-pattern identification.

FIG. 8 shows the architecture of the sequencer in FIG. 6b according to this invention. It includes a control unit 801, a memory command generator 803, a sequence generator 805, an address generator 807, and a syndrome handling unit 809.

The control unit 801 is the interface between the sequencer and the external ATE (not shown in FIG. 8). It receives sequencer activation command and encoded data from the sequencer, and does the hand-shaking communication with the external ATE. The control unit 801 implements the FSM shown in FIG. 7. It controls the memory command generator 803, sequence generator 805, and address generator 807 to generate the test commands and address sequences defined by the test algorithm for the TPG (not shown in FIG. 8). The memory command generator 803 generates and outputs memory test commands. The address generator 807 generates and outputs memory address. The sequence generator 805 generates address sequences based on a predefined testing procedure to control the memory command generator 803 and the address generator 807, and inputs these address sequences to the control unit 801.

The syndrome handling unit 809 includes an error-handling controller 809a, a compressor 809b, and a shift-out register 809c. The shift-out register 809c is only active during the Shift-out state. The compressor 809b compresses the fault syndrome from the TPG, and it is implemented also by an FSM. It works during the fault syndrome shifting process.

During each clock cycle, the shift-out register 809c shifts out a bit of the fault syndrome to the external ATE, and the compressor 809b generates a bit of the code-word (i.e., the compressed syndrome) to the shift-out register 809c simultaneously. In this invention, the compression is done on-the-fly with the shifting process, so it does not need extra time. The area overhead of compressor 809b required for this scheme is less than that for building Huffman table scheme. The compressor 809b has about 100 logic gates In the present invention, the fail-pattern identification can be applied in the BISR design as well. This invention can implement the must-repair phase of redundancy analysis. The flexibility of the spare elements is emphasized in this invention rather than the phase-2 RA algorithms. This invention partitions a spare row into several spare words. The remaining faulty words after phase-1 can be repaired by spare words (spare-word repair scheme) instead of spare rows, which increases redundancy utilization. When faults in the memory array are detected, the BIRA and the AR modules perform the analysis and address reconfiguration, respectively. This spare-word repair scheme can be represented by the state diagram shown in FIG. 9.

Figure 9:
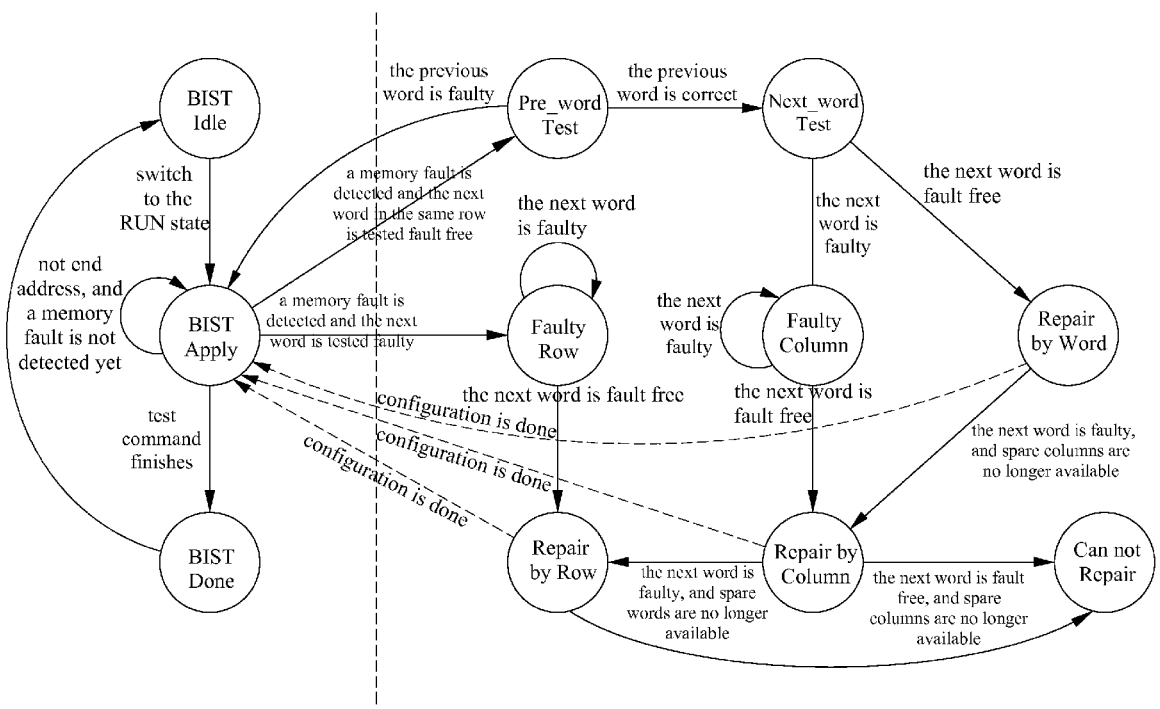
FIG. 9 shows the state diagram of the spare-word repair scheme performed by the FSM in the sequencer according to the invention.

According to this invention, a sequencer with spare-word repair scheme has eleven states as shown in FIG. 9. Some states of the BISR design are similar to the BISD design in this invention, i.e., test execution states and fail-pattern identification states. The shift out state is replaced by address reconfiguration states which are Repair by Word state, Repair by Column state, Repair by Row state, and Can not Repair state. These address reconfiguration states are used to repair the faulty cell with more suitable redundancy, and thus the utilization of the spare elements is improved.

These address reconfiguration states are described in detail herein below.

(a) Repair by Word: in Next_word Test state, if the next word is correct, the WUT is a single word fault and the sequencer switches to the Repair by Word state, where the WUT is repaired by a spare word. After that, it goes to the BISTAapply state and resumes the test process (dashed line in FIG. 9). If spare words are no longer available, it goes to Repair by Column state.

(b) Repair by Column: in this state, it needs to check a flag first. This flag is used to indicate whether the current state has been reached from the faulty column state or repair by word state. If it is reached from Faulty Column state and spare columns are no longer available, it goes to Can not Repair state. If it is reached from Repair by Word state and spare columns are no longer available, it goes to Repair by Row state. After the faulty column or word is repaired, it returns to BIST Apply state and resumes the testing process.

(a) Repair by Row: the state repairs the faulty row or single word fault with a spare row. If there is no available spare row, it goes to Can not Repair state, else it returns to BIST Apply state and resumes the testing process.

(b) Can not Repair: when the fault cannot be repaired, it goes to this state, and generates the "no go" output.

Figure 10:
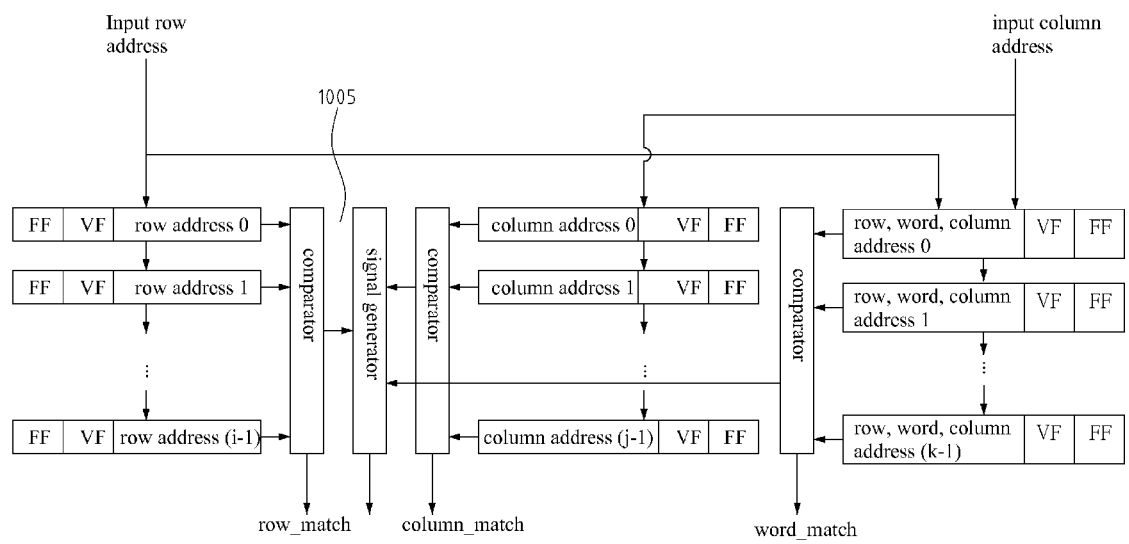
FIG. 10 shows a circuit diagram of the AR design according to the invention.

The AR circuit is another important component of BISR design. FIG. 10 shows the AR circuit of BISR design, which mainly contains a plurality of storage elements (registers), a plurality of comparators, and a signal generator. Each storage element stores the information of a faulty cell.

Since the spare-word repair scheme uses three types of redundancy, i.e., spare rows, spare columns, and spare words, there are three types of storage element for comparing row address, column address and word address, respectively in the AR circuit. Each storage element has two flags: 1) the fault flag (FF) presents whether the corresponding spare element is defective or fault-free; 2) the valid flag (VF) indicates whether the stored fault address is valid or not. The FF is used to mark faulty spare elements, if a spare element is faulty under spare memory testing, the FF sets to high. The VF flag indicates the validity of the address stored in the storage element.

In normal access mode, the addresses stored in the storage elements are compared with required/access address concurrently. Therefore, it reduces the address comparison time. If the access address hits the stored address (i.e., the access word is faulty), the signal generator 1005 generates a signal to remap the address to spare elements. In the test/repair mode, when a new fault address is received, the AR circuit compares it with all the stored addresses with FF=0 and VF=1. If there is no match, that means the address is a new one, the received address is stored in the storage elements. The storage element allocated to the new fault address must be a fault-free unused one with FF=0 and VF=0.

According to the BISD design of this invention, the length of the Huffman symbol affects the syndrome compression ratio, so do the defect distribution, fail pattern distribution, etc.

In summary, this invention provides an efficient memory diagnosis and repair method and apparatus based on fail-pattern identification. The diagnosis scheme of this invention can distinguish faulty row segments, faulty column segments, and single faulty words, and their combinations, such as faulty row segments and single faulty words, faulty column segments and single faulty words, all of single faulty words, faulty row segments and faulty column segments, and so on. In this invention, a compression method is applied in the fault syndrome compression. Therefore, the amount of the data transmitted from the chip under test to automatic test equipment is significantly reduced without losing fault information. The BISR scheme of this invention can implement the must-repair phase by the fail-pattern identification, and then more flexible RA scheme and efficient spare-word repair scheme are applied to replace the faulty cells with spare memories. This invention uses fewer spare elements than other redundancy analysis schemes under the same repair rate.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of build-in self-diagnosis and repair in a memory with syndrome identification, comprising the steps of:

(a) applying a fail-pattern identification and a syndrome-format structure to identify at least one type of faulty syndrome in the memory during a memory testing, then generating and exporting fault syndrome information associated with a corresponding faulty syndrome; and (b) according to said fault syndrome information, applying a redundancy analysis algorithm, allocating spare memory elements and repairing faulty cells in the memory;

wherein said syndrome-format structure respectively applies single-faulty-word-syndrome format, faulty-row-segment-syndrome format, and faulty-column-segment-syndrome format for different faulty syndromes.

2. The method of build-in self-diagnosis and repair in a memory with syndrome identification as claimed in claim 1, wherein said at least one type of faulty syndrome includes single faulty words.

3. The method of build-in self-diagnosis and repair in a memory with syndrome identification as claimed in claim 1, wherein said at least one type of faulty syndrome includes faulty column segments and single faulty words.

4. The method of build-in self-diagnosis and repair in a memory with syndrome identification as claimed in claim 1, wherein said at least one type of faulty syndrome includes faulty row segments and single faulty words.

5. The method of build-in self-diagnosis and repair in a memory with syndrome identification as claimed in claim 1, wherein said at least one type of faulty syndrome includes faulty column segments.

6. The method of build-in self-diagnosis and repair in a memory with syndrome identification as claimed in claim 1, wherein said at least type of faulty syndrome includes faulty row segments.

7. The method of build-in self-diagnosis and repair in a memory with syndrome identification as claimed in claim 1, wherein said at least one type of faulty syndrome includes faulty column segments, faulty row segments and single faulty words.

8. The method of build-in self-diagnosis and repair in a memory with syndrome identification as claimed in claim 1, wherein said single-faulty-word-syndrome format includes a syndrome identifier field for storing a single-faulty-word pattern, a session field for storing a read operation that detects a single faulty word, an address field for storing the address of the single fault word, and a compressed word syndrome field for storing a compressed word syndrome of an original word syndrome.

9. The method of build-in self-diagnosis and repair in a memory with syndrome identification as claimed in claim 1, wherein faulty-row-segment-syndrome format includes a syndrome identifier field for storing a faulty-row-segment pattern, a session field for storing a read operation that detects a faulty row segment, an address field for indicating the staffing word address of the first faulty word, an end column field for storing the column address of a last faulty word in the faulty row, and an end row indicator field through which the row address of the last faulty word is known.

10. The method of build-in self-diagnosis and repair in a memory with syndrome identification as claimed in claim 1, wherein faulty-column-segment-syndrome format includes a syndrome identifier field for storing a faulty-column-segment pattern, a session field for storing a read operation that detects a faulty column segment, an address field for indicating the starting word address of the first faulty word, an end row field for storing the row address of a last faulty word in the faulty column, an end column indicator field through which the row address of the last faulty word is known, and a compressed syndrome field is for storing a compressed word syndrome of an original word syndrome.

11. The method of build-in self-diagnosis and repair in a memory with syndrome identification as claimed in claim 1, wherein said step (a) is performed according to at least one of the following conditions:
   (a1) when a faulty word in a row is identified, the word immediately adjacent to said faulty word in said row is tested, and if the adjacent word is also faulty, a next adjacent word in said row is tested until a fault-free word, and said row is referred to as a faulty row;
   (a2) identification of a faulty column using the following three condition-checking steps:
      (a21) the word adjacent to said faulty word in said row is tested fault free, and said row is excluded from being a faulty row,
      (a22) when the word immediately above said faulty word in a same column of said faulty word is tested faulty, all the words above said faulty word in the same column are excluded from further testing, and
      (a23) when the word immediately under said faulty word in the same column is tested faulty, a next adjacent word in the same column is tested until a fault-free word, and the same column is referred to as a faulty column; and
   (a3) when a word is tested faulty but is not part of a faulty row or faulty column, it is referred to as a single faulty-word.

12. The method of build-in self-diagnosis and repair in a memory with syndrome identification as claimed in claim 1, wherein said redundancy analysis algorithm in said step (b) includes a must-repair phase and a remaining-faulty word-repair phase, wherein a spare-word repair method is adopted in a redundancy structure in said remaining-faulty word-repair phase, and said redundancy structure includes three types of redundancy repair, said three types of redundancy repair are repair-by-row, repair-by-column, and repair-by-word.

13. The method of build-in self-diagnosis and repair in a memory with syndrome identification as claimed in claim 12, wherein said repair-by-word is performed by repairing a faulty word with a spare word, and said repair-by-row is performed by repairing a faulty row with a spare row, and said repair-by-column is performed by repairing a faulty column with a spare column.

14. An apparatus of build-in self-diagnosis and repair in a memory with syndrome identification, comprising:
   a build-in self-test circuit;
   a build-in redundancy analysis circuit; and
   an address reconfiguration circuit;
   wherein a fail-pattern identification and a syndrome-format structure are implemented for identifying at least one type of faulty syndrome in the memory during a memory testing, and said syndrome-format structure respectively applies faulty-word-segment-syndrome format, faulty-row-segment-syndrome format, and faulty-column-segment-syndrome format for different faulty syndromes.

15. The apparatus of build-in self-diagnosis and repair in a memory with syndrome identification as claimed in claim 14, said build-in self-test circuit further including:
   a sequencer for receiving encoded data and activation commands to perform test commands and fault syndrome identification for said memory, compressing fault syndrome information, and shifting out compressed fault syndrome information during said memory testing; and
   a test pattern generator for decoding said test commands sent from said sequencer and forwarding said fault syndrome information to said sequencer for analysis and compression;
   wherein said build-in-redundancy-analysis circuit performs redundancy analysis and spare elements configuration according to said compressed fault syndrome information and a built-in redundancy analysis algorithm, and said address reconfiguration circuit performs address reconfiguration when a fault in said memory is detected, and repairs faulty memory cells.

16. The apparatus of build-in self-diagnosis and repair in a memory with syndrome identification as claimed in claim 14, wherein said build-in-redundancy-analysis circuit is implemented by a finite state machine, which has a state diagram including test execution state, fail-pattern identification state, and address reconfiguration state.

17. The apparatus of build-in self-diagnosis and repair in a memory with syndrome identification as claimed in claim 15, said sequencer further including:
   a controller for receiving said encoded data said and activation commands, executing said test commands and said syndrome identification for said memory, and handshaking with an external automatic test equipment;
   a memory command generator for generating and outputting memory test commands;

an address generator for generating and outputting addresses of said memory;

a sequence generator for generating a sequence order based on a predefined testing procedure to control the output of said memory command generator and said address generator; and a syndrome handling unit for receiving, compressing said fault syndrome information and then shifting out said compressed fault syndrome information.

18. The apparatus of build-in self-diagnosis and repair in a memory with syndrome identification as claimed in claim 17, wherein said syndrome handling unit includes an error-handling controller, a compressor for compressing said fault syndrome information to a code-word, and a shift-out register.

19. The apparatus of build-in self-diagnosis and repair in a memory with syndrome identification as claimed in claim 18, wherein said shift-out register shifts out a bit of said compressed fault syndrome information to said external automatic test equipment, and said Huffman compressor generates a bit of said code-word to said shift-out register simultaneously in a clock cycle.

20. The apparatus of build-in self-diagnosis and repair in a memory with syndrome identification as claimed in claim 15, wherein said address reconfiguration circuit includes plural storage elements, plural comparators, and a signal generator, and each of said storage elements stores the information of a faulty cell.

21. The apparatus of build-in self-diagnosis and repair in a memory with syndrome identification as claimed in claim 20, wherein said address reconfiguration circuit has three types of storage elements for address comparison, and said three types of storage elements store row address, column address, and word address.

22. The apparatus of build-in self-diagnosis and repair in a memory with syndrome identification as claimed in claim 21, wherein each of said storage elements includes two flags and one memory cell address.

23. The apparatus of build-in self-diagnosis and repair in a memory with syndrome identification as claimed in claim 22, wherein said two flags are defective flag and valid flag, and said memory cell address is row address or column address or word address, and said defective flag presents whether a corresponding spare element is defective or fault-free, and said valid flag indicates whether a stored fault address is valid or invalid.

* * * * *